United States Patent [19]

Horita et al.

[11] Patent Number: 5,187,717
[45] Date of Patent: Feb. 16, 1993

[54] TUNABLE SEMICONDUCTOR LASER

[75] Inventors: Masayoshi Horita, Ichigayata; Katsuyuki Utaka, Tokyo; Yuichi Matsushima, Tokorozawa, all of Japan

[73] Assignee: Kokusai Denshin Denwa Kabushiki Kaisha, Tokyo, Japan

[21] Appl. No.: 770,170

[22] Filed: Oct. 2, 1991

[30] Foreign Application Priority Data

Oct. 11, 1990 [JP] Japan .................................. 2-270522

[51] Int. Cl.⁵ ................................................ H01S 3/08
[52] U.S. Cl. .................................................. 372/96
[58] Field of Search ........................ 372/20, 32, 50, 96

[56] References Cited

U.S. PATENT DOCUMENTS

| | | | |
|---|---|---|---|
| 4,829,535 | 5/1989 | Utaka | 372/96 |
| 4,835,779 | 5/1989 | Liou | 372/96 |
| 4,856,005 | 8/1989 | Oe et al. | 372/96 |
| 5,012,484 | 4/1991 | Flynn et al. | 372/96 |

Primary Examiner—John D. Lee
Assistant Examiner—Robert E. Wise
Attorney, Agent, or Firm—Emmanuel J. Lobato; Robert E. Burns

[57] ABSTRACT

A wavelength-tunable semiconductor laser of distributed feedback (DFB) type wherein a diffraction grating having periodic corrugations along the direction of travel of light is formed on an active layer of at least one of layers adjacent thereto. An electrode on one side is separated into four or more electrodes in the direction of the cavity of the laser. Nonadjoining ones of them are electrically connected to form two electrode groups. The total length of first regions corresponding to a first one of the two electrode groups is larger than the total length of second regions corresponding to the second electrode group. The refractive indexes of the first regions are changed through current injection change to the first electrode group to vary the lasing wavelength and the gain of the second regions is controlled through current injection to the second electrode group, thereby generating output light of a constant output power and a variable single wavelength.

2 Claims, 3 Drawing Sheets

TUNABLE SEMICONDUCTOR LASER

BACKGROUND OF THE INVENTION

The present invention relates to a tunable semiconductor laser which has a wide tuning range and exhibits a narrow-linewidth characteristic.

A distributed feedback (DFB) semiconductor laser with three electrodes has been studies for wavelength tuning and linewidth reduction. However, it has not realized to obtain a wave-length-tunable semiconductor laser which has necessarily and sufficiently a wide tuning range and a narrow line width.

SUMMARY OF THE INVENTION

An object of the present invention is to provide a wavelength-tunable semiconductor laser which has a wider tuning range and better linewidth characteristics than in the past.

To attain the above object, the wavelength-tunable semiconductor laser of the present invention, comprises a distributed feedback semiconductor laser of the type wherein a diffraction grating having periodic corrugations along the direction of travel of light is formed on an active layer or at least one of layers adjacent thereto, has a structure in which an electrode on one side is separated into four or more electrodes in the direction of the cavity, nonadjoining ones of them are electrically connected to form two electrode groups and the total length of first regions corresponding to a first one of the two electrode groups is larger than the total length of second regions corresponding to the second electrode group. The refractive indexes of the first regions are changed through current injection change to the first electrode group to vary the lasing wave-length and the gain of the second regions is controlled through current injection to the second electrode group, thereby generating output light of a constant output power and a variable single wavelength.

That is, according to the present invention, in the distributed feedback semiconductor laser (hereinafter referred to as a DFB laser) which can be expected to exhibit an excellent single-wavelength lasing characteristic even in case of high-speed modulation, the electrode for current injection is split into four or more electrodes in the direction of the cavity, nonadjacent ones of them are electrically connected together to form two electrode groups so that the current injection to active layers in the regions corresponding to the respective electrodes can be made using the individual electrodes. These regions are divided into two groups of wavelength control regions and gain control regions respectively corresponding to the two electrode groups, and the both regions are arranged alternately with each other. In this instance, the lengths of each electrode and each region are set so that the total length of the wavelength control regions is larger than the total length of the gain control regions. It is proper that the total length ratio of the wavelength control regions and the gain control regions is in the range of 5:1 to 5:4. The refractive index in each wavelength control region is changed through current injection change thereto to vary the lasing wavelength and the overall gain is held constant by controlling current injection to the gain control regions, by which it is possible to obtain output light of a constant output power and a variable single wavelength.

Uniform current injection to the DFB laser will provide output light of a wavelength $\lambda_0$, which is given by $\lambda_0 = 2\Lambda n$, where $\Lambda$ is the period of the diffraction grating and n is the refractive index of the light emitting layer. Since the refractive index n can be varied with the carrier density in the light emitting layer through utilization of the plasma effect, it has been found that the lasing wavelength varies with the change of the refractive index.

In the above-described structure in which the total length of the wavelength control regions is larger than the total length of the gain control regions, when the refractive index of the wavelength control region is changed to n' by changing the current injection thereto, the change in the refractive index of the wavelength control region governs the overall lasing wavelength, which varies to a wavelength $\lambda'$ given by $\lambda' = 2\Lambda n'$. On the other hand, the intensity of the output light also varies correspondingly, but the overall gain can be held constant through control of the injection current to the gain control regions by changing it with an increase or decrease in current in the wavelength control regions.

Moreover, since the wavelength control regions and the gain control regions are disposed dispersedly throughout the cavity of the laser, nonuniformity of parameters such as the refractive index and gain in the laser cavity is also effectively suppressed with respect to variations of the lasing wavelength, and consequently, the linewidth is less degraded.

BRIEF DESCRIPTION OF THE DRAWINGS

The present invention will be described in detail below in comparison with prior art with reference to accompanying drawings, in which.

DETAILED DESCRIPTION

To make differences between prior art and the present invention clear, an example of prior art will first be described.

Figure 3:
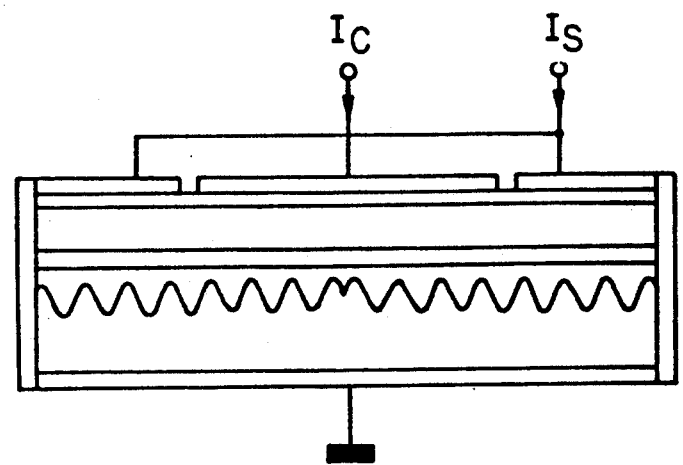
FIG. 3 is a cross-sectional view of a conventional narrow-linewidth, tunable semiconductor laser.

A semiconductor laser that has been studied for wavelength tuning and linewidth reduction is a long cavity DFB (distributed feedback) semiconductor laser with three electrodes, such as shown in FIG. 3, and it has been reported that the semiconductor laser exhibits a maximum continuous tuning range of 1.9 nm and a minimum linewidth of 550 kHz ("TUNABLE, NARROW-LINEWIDTH AND HIGH-POWER λ/4-SHIFTED DFB LASER," ELECTRONICS LETTERS, Jul. 20, 1989, Vol. 25, No. 15, pp990-992).

With the illustrated structure, the hole burning effect is controlled by controlling a ratio of a current Ic of a center portion to a current Is of side portions to vary the threshold carrier density, thus achieving wavelength tuning.

In coherent transmission systems which can be expected to lengthen a repeater spacing and increase a line capacity as compared with conventional transmitting systems, it is indispensable that the light source at the transmitting side and the light source employed as a local oscillator at the receiving side be narrow in linewidth and variable in oscillation wavelength, and their linewidth is required to remain narrow irrespective of wavelength variations.

In such a prior art wavelength-tunable semiconductor laser as shown in FIG. 3, which is operated by controlling the hole burning effect in the central portion, however, the wavelength tuning range is not so wide as aimed at, because of a limit to the variation in the carrier density by suppression of the hole burning effect. Furthermore, to enlarge the wavelength tuning range closely to its limit, it is necessary to substantially vary the ratio of the current of the center portion to the current of the side portions. With large variation of the current ratio, however, the carrier density and the distribution of refractive index in the laser become appreciably nonuniform in the direction of travel of light, resulting in an increased linewidth. Accrodingly, it is impossible to obtain a wavelength-tunable semiconductor laser which has necessarily and sufficiently a wide tuning range and a narrow linewidth.

The present invention will now be described.

EMBODIMENT 1

Figure 1:
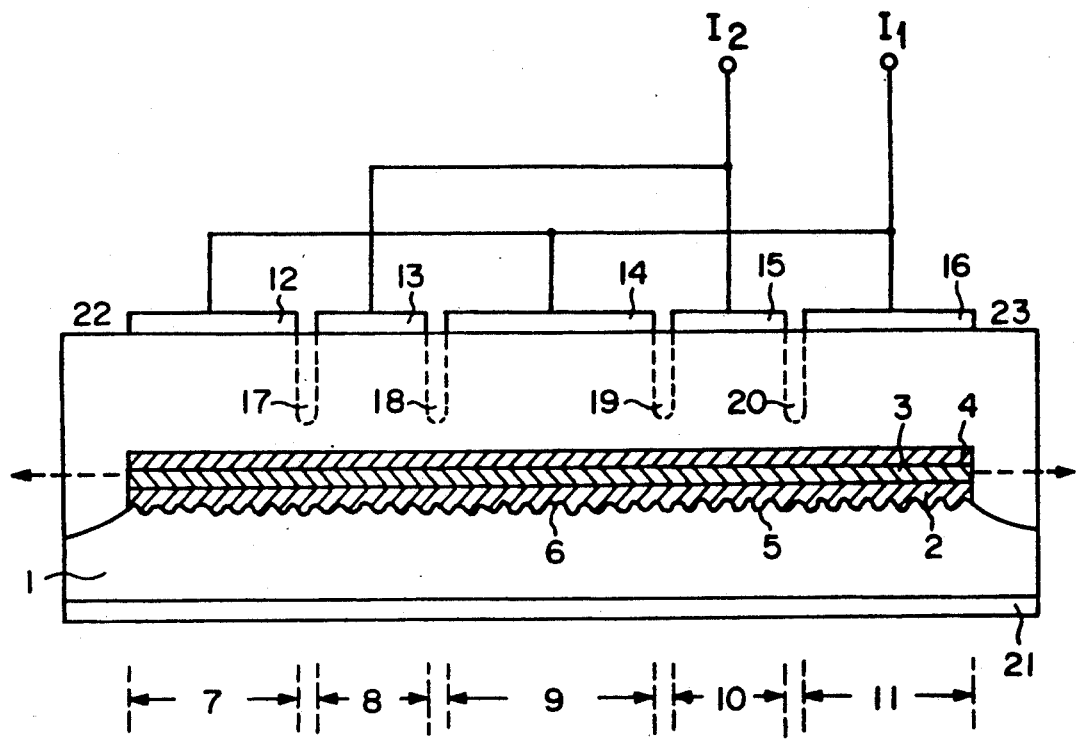
FIG. 1 is a cross-sectional view illustrating a semiconductor laser of Embodiment 1 according to the present invention.

FIG. 1 illustrates a first embodiment of the present invention. In FIG. 1, reference numeral 1 indicates an n-type InP substrate, 2 an n-type InGaAsP waveguide layer, 3 an InGaAsP active layer, 4 an InGaAsP buffer layer and 5 a diffraction grating having a quarter-wavelength phase shift point 6 at the center thereof. The active layer 3 is divided into five regions 7, 8, 9, 10 and 11 along the direction of travel of light, and electrodes 12, 13, 14, 15 and 16 are formed on the respective regions. The electrodes 12, 14 and 16 are electrically interconnected to form a first electrode group, whereas the electrodes 13 and 15 are electrically interconnected to form a second electrode group. The lengths of the regions 7, 8, 9, 10 and 11 are 225 $\mu$m, 100 $\mu$m, 150 $\mu$m, 100 $\mu$m and 225 $\mu$m, respectively, and the total cavity length is 800 $\mu$m. Reference numerals 17, 18, 19 and 20 denote high resistance regions for electrical isolation, which can be formed by implantation of proton and so on. Reference numeral 21 identifies an n-side electrode. In the vicinities of both facets there are provided window structures 22 and 23 for preventing reflection from the facets.

In this embodiment the regions 7, 9 and 11 are wavelength control regions and the regions 8 and 10 are gain control regions. The ratio in length between the both regions is about 3:1. As described previously, it is possible to vary the lasing wavelength by changing a current $I_1$ which is injected to the wavelength control regions and to maintain the overall gain constant by controlling a current $I_2$ which is injected to the gain control regions.

EMBODIMENT 2

Figure 2:
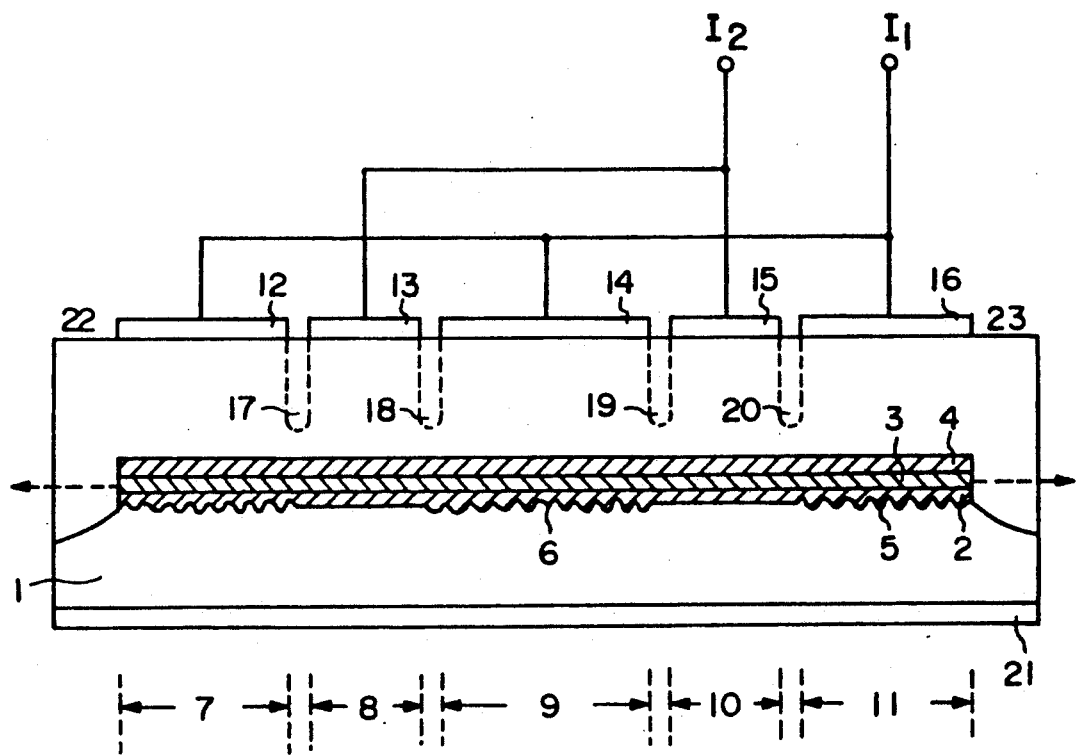
FIG. 2 is a cross-sectional view illustrating a semiconductor laser of Embodiment 2 according to the present invention.

FIG. 2 illustrates a second embodiment of the present invention. This embodiment is identical in structure with Embodiment 1 except that no diffraction grating is provided in each gain control region, and the mechanisms for wavelength tuning and gain control are also the same as those in Embodiment 1. When the current to gain control region is changed for gain control, the refractive index of the region also varies, but since the region has no diffraction grating in this structure, the refractive index variation will not cause any disturbance to the lasing wavelength. Accordingly, this embodiment can be expected to achieve more stable single-wavelength operation and wider tuning range.

If the lasing wavelength is greatly deviated from $\lambda$, then unbalance between the amounts of injection currents increases accordingly, but by employing a structure in which, for example, the length per unit region is further reduced to increase the number of regions for further homogenization of the refractive index and other parameters in the cavity, the effective cavity length can be held substantially constant, and hence deterioration of the linewidth can be prevented. Accordingly, in these embodiments, though described to have five electrodes (i.e. regions), as the number of electrodes increases in excess of at least four, the intracavity homogeneity of such parameters as the refractive index and gain improves.

The linewidth can be made narrower by making the overall cavity length longer.

Moreover, a narrow-linewidth device can be obtained by introducing such a quantum effect as MQW or the like into the light emitting layer.

While in the above no particular reference is made to the optical waveguide structure, all waveguide structures, including a buried structure, can be employed. Besides, as regards semiconductor materials, the present invention can be used not only those of the aforementioned InGaAsP/InP systems but also with other semiconductor materials of InAlGaAs/InP, AlGaAs/GaAs systems and so forth.

As described above, according to the present invention, it is possible to realize a semiconductor laser, which is continuously tunable, has a wide tuning range and a narrow linewidth uniformly over the entire tuning range and can be used as a single-wavelength light source.

The tunable semiconductor laser according to claim 1 can be expected, theoretically, to achieve a continuous tuning range of 5 nm or more and a linewidth below 500 kHz.

The tunable semiconductor laser according to claim 2 can be expected to achieve a more stable single-wavelength operation and a wider tuning range.

The semiconductor laser according to the present invention is very promising as a light source for coherent transmission, optical measurements, etc., and hence is of great utility.

What we claim is:

1. A tunable distributed feedback semiconductor laser in which a diffraction grating having periodic corrugations along the direction of travel of light is formed on at least one of an active layer and layers adjacent thereto, characterized by a structure wherein an electrode on one side is separated into four or more electrodes in the direction of a cavity of said laser, nonadjoining ones of them are electrically connected to form two electrode groups, the total length of first regions corresponding to a first one of said electrode groups is larger than the total length of second regions corresponding to a second electrode group, the refractive index of each of said first regions is changed by current injection change to said first electrode group to thereby vary the lasing wavelength, and the gain of each of said second regions is controlled by current injection to said second electrode group, whereby output light of a constant output power and a variable single wavelength is produced.

2. A tunable semiconductor laser according to claim 1, characterized in that periodic corrugations are not formed on any of active layers and layers adjacent to said active layers of said second regions.

* * * * *